United States Patent
Gillingham

(10) Patent No.: US 8,825,966 B2
(45) Date of Patent: Sep. 2, 2014

(54) REDUCED PIN COUNT INTERFACE

(75) Inventor: Peter Gillingham, Kanata (CA)

(73) Assignee: MOSAID Technologies Incorporated, Ottawa (CA)

(*) Notice: Subject to any disclaimer, the term of this patent is extended or adjusted under 35 U.S.C. 154(b) by 0 days.

(21) Appl. No.: 13/364,685

(22) Filed: Feb. 2, 2012

(65) Prior Publication Data

US 2012/0137030 A1 May 31, 2012

Related U.S. Application Data

(62) Division of application No. 11/843,024, filed on Aug. 22, 2007, now Pat. No. 8,122,202.

(51) Int. Cl.
   G06F 12/08 (2006.01)
   G11C 7/22 (2006.01)
   G11C 7/10 (2006.01)
   G06F 13/16 (2006.01)

(52) U.S. Cl.
   CPC .............. *G11C 7/1045* (2013.01); *G11C 7/22* (2013.01); *G11C 7/1078* (2013.01); *G06F 13/1678* (2013.01); *G11C 7/1093* (2013.01)
   USPC ........... 711/154; 711/149; 711/169; 711/170; 711/203; 711/E12.016; 710/48

(58) Field of Classification Search
   USPC .......... 711/154, 149, 169, 170, 203, E12.016; 710/48
   See application file for complete search history.

(56) References Cited

U.S. PATENT DOCUMENTS

| | | | |
|---|---|---|---|
| 4,174,536 A | 11/1979 | Misunas et al. | |
| 4,617,566 A | 10/1986 | Diamond | |
| 4,796,231 A | 1/1989 | Pinkham | |
| 4,899,316 A | 2/1990 | Nagami | |
| 5,132,635 A | 7/1992 | Kennedy | |
| 5,204,669 A | 4/1993 | Dorfe et al. | |
| 5,229,657 A | 7/1993 | Rackley | |
| 5,243,703 A | 9/1993 | Farmwald et al. | |
| 5,319,598 A | 6/1994 | Aralis et al. | |
| 5,404,460 A | 4/1995 | Thomsen et al. | |
| 5,430,859 A | 7/1995 | Norman et al. | |
| 5,452,259 A | 9/1995 | McLaury | |
| 5,475,854 A | 12/1995 | Thomsen et al. | |
| 5,602,780 A | 2/1997 | Diem et al. | |

(Continued)

FOREIGN PATENT DOCUMENTS

| | | |
|---|---|---|
| WO | 0169411 A2 | 9/2001 |
| WO | 2006036811 A2 | 4/2006 |

OTHER PUBLICATIONS

Samsung Electronics Co. Ltd., 256 M×8 Bit/ 128M×16 Bit/512M × 8 Bit NAND Flash Memory, K9K4G08U1M, K9F2G08U0M, K9F2G16U0M, Revision 1.0, 1-41, May 6, 2005.

(Continued)

*Primary Examiner* — Yong Choe
(74) *Attorney, Agent, or Firm* — Ridout & Maybee LLP

(57) ABSTRACT

An arrangement of memory devices and a controller is based on an interface with a reduced pin count relative to a known memory device and controller arrangement. Facilitating the reduced pin count interface are some operations performed by the controller. The controller determines a width for a Data bus while assigning a target device address to each of the memory devices.

18 Claims, 12 Drawing Sheets

(56) References Cited

U.S. PATENT DOCUMENTS

| | | |
|---|---|---|
| 5,671,178 A | 9/1997 | Park et al. |
| 5,740,379 A | 4/1998 | Hartwig |
| 5,778,419 A | 7/1998 | Hansen et al. |
| 5,802,399 A | 9/1998 | Yumoto et al. |
| 5,828,899 A | 10/1998 | Richard et al. |
| 5,859,809 A | 1/1999 | Kim |
| 5,941,974 A | 8/1999 | Babin |
| 6,002,638 A | 12/1999 | John |
| 6,091,660 A | 7/2000 | Sasaki et al. |
| 6,144,576 A | 11/2000 | Leddige et al. |
| 6,148,364 A | 11/2000 | Srinivasan et al. |
| 6,304,921 B1 | 10/2001 | Rooke |
| 6,317,350 B1 | 11/2001 | Pereira et al. |
| 6,317,352 B1 | 11/2001 | Halbert et al. |
| 6,317,812 B1 | 11/2001 | Lofgren et al. |
| 6,594,183 B1 | 7/2003 | Lofgren et al. |
| 6,658,509 B1 | 12/2003 | Bonella et al. |
| 6,680,904 B1 | 1/2004 | Kaplan et al. |
| 6,715,044 B2 | 3/2004 | Lofgren et al. |
| 6,763,426 B1 | 7/2004 | James et al. |
| 6,816,933 B1 | 11/2004 | Andreas |
| 6,850,443 B2 | 2/2005 | Lofgren et al. |
| 6,853,557 B1 | 2/2005 | Haba et al. |
| 6,853,573 B2 | 2/2005 | Kim et al. |
| 6,928,501 B2 | 8/2005 | Andreas et al. |
| 6,944,697 B2 | 9/2005 | Andreas |
| 6,950,325 B1 | 9/2005 | Chen |
| 6,996,644 B2 | 2/2006 | Schoch et al. |
| 7,024,501 B1 | 4/2006 | Wright |
| 7,031,221 B2 | 4/2006 | Mooney et al. |
| 7,032,039 B2 | 4/2006 | DeCaro |
| 7,093,076 B2 | 8/2006 | Kyung |
| 7,130,958 B2 | 10/2006 | Chou et al. |
| 7,177,170 B2 | 2/2007 | Gomm |
| 7,180,778 B2 | 2/2007 | Kawai et al. |
| 7,853,727 B2 | 12/2010 | Pyeon et al. |
| 7,894,294 B2 | 2/2011 | Pyeon |
| 7,991,925 B2 | 8/2011 | Sumi et al. |
| 8,010,710 B2 | 8/2011 | Sumi |
| 2002/0188781 A1 | 12/2002 | Schoch et al. |
| 2004/0001380 A1 | 1/2004 | Becca et al. |
| 2004/0024960 A1 | 2/2004 | King et al. |
| 2004/0148482 A1* | 7/2004 | Grundy et al. ............... 711/167 |
| 2005/0071582 A1 | 3/2005 | Sohn et al. |
| 2005/0078535 A1 | 4/2005 | Choi et al. |
| 2005/0081012 A1 | 4/2005 | Gillingham et al. |
| 2005/0166006 A1 | 7/2005 | Talbot et al. |
| 2006/0031593 A1 | 2/2006 | Sinclair |
| 2006/0067156 A1 | 3/2006 | Ruckerbauer et al. |
| 2006/0248305 A1 | 11/2006 | Fang et al. |
| 2007/0038852 A1 | 2/2007 | Bovino et al. |
| 2007/0064629 A1 | 3/2007 | Regev et al. |
| 2007/0076479 A1 | 4/2007 | Kim et al. |
| 2007/0076502 A1 | 4/2007 | Pyeon et al. |
| 2007/0109833 A1 | 5/2007 | Pyeon et al. |
| 2007/0153576 A1 | 7/2007 | Oh et al. |
| 2007/0157000 A1 | 7/2007 | Qawami et al. |
| 2007/0233903 A1 | 10/2007 | Pyeon |
| 2007/0233917 A1 | 10/2007 | Pyeon et al. |
| 2007/0234071 A1 | 10/2007 | Pyeon |
| 2008/0016269 A1* | 1/2008 | Chow et al. ............... 711/103 |
| 2008/0019189 A1 | 1/2008 | Lin |
| 2008/0019196 A1 | 1/2008 | Lin |
| 2008/0140948 A1 | 6/2008 | Pyeon et al. |
| 2008/0181214 A1 | 7/2008 | Pyeon et al. |
| 2008/0192649 A1 | 8/2008 | Pyeon et al. |
| 2008/0195613 A1 | 8/2008 | Sumi et al. |
| 2008/0215778 A1 | 9/2008 | Sumi |

OTHER PUBLICATIONS

"2GBIT (256×8 Bits) CMOS NAND E2PROM", TH58NVG1S3AFT05, Toshiba MOS Digital Integrated Circuit Silicon Gate CMOS, 1-32, May 19, 2003.

64 Megabit CMOS 3.0 Volt Flash Memory With 50MHZ SPI (Serial Peripheral Interface) Bus Data Sheet (Preliminary) Publication No. S25FL064A, 1-32, Sep. 6, 2006.

Kennedy, Joseph et al, "A 2GB/S Point to Point Heterogeneous Voltage CAPAGLE DRAM Interface for Capacity-Scalable Memory Subsystems" ISSCC 2004/ Session 1/ DRAM/ 11.8, IEEE International Solid-State Circuits Conference, 1-10, Feb. 15, 2004.

Takeuchi, K. et al, A 56NM CMOS 99MM2 8GB Multi-Level NAND Flash Memory With 10MB/S Program Throughput, Solid-State Circuits, 2006 IEEE International Conference Digest of Technical Papers, Session 7, ISBN:1-4244-0079-1, 10 pages, Feb. 6, 2006.

Gjessing, S. et al, A RAM Link for High Speed, Special Report/Memory, IEEE Spectrum, Oct. 1992, 52-53.

King, Craig, L. et al, Communicating With Daisy Chained MCP42XXX Digital Potentiometers Microchip AN747, 1-8, Jan. 30, 2001.

"DDR2 Fully Buffered DIMM 240 Pin FBDIMMS Based on 512 MB C-DIE" (ROHS Compliant) Rev. 1.3, 1-32, Sep. 1, 2006.

M-Systems Flash Disk Pioneers Ltd., "DISKONCHIP H1 4GB (512 MBYTE) and 8 GB (1 GBYTE) High Capacity Flash Disk With NAND and x2 Technology" Data Sheet, Rev. 0.5 (Preliminary), 1-66, Jan. 1, 2005.

Oshima, Y. et al, High-Speed Memory Architectures for Multimedia Applications—Meeting the Requirements of Higher Performance, Circuits and Devices, IEEE 2755-3996/97, Jan. 1997, 8-13.

High Speed Small Sectored SPI Flash Memory 4M (524,288.8) AT25FS040 Advance Information, 1-23, Sep. 1, 2006.

Hypertransport TM IO Link Specification, Revision 3.00, Document No. HTC20051222-0046-0008, Hyperstransport Technology Consortium, 1-428, Apr. 21, 2006.

IEEE Standard for High-Bandwidth Memory Interface Based on Scalable Coherent Interface (SCI) Signaling Technology (RAMLink), IEEE STD. 1596.4-1996, The Institute of Electrical Electronics Engineers, Inc., 98 pages, Mar. 19, 1996.

Intel Advanced Boot Block Flash Memory (C3), 28F800C, 28F160C3, 28F320C3(16) Datasheet Product Features Order No. 290645, Revision: 023, 1-72, May 1, 2005.

Choudhury, S., "International Patent Application No. PCT/CA2007/001789, Search Report", 47-50, Jun. 4, 2008.

"K9XXG08UXM Preliminary Flash Memory" Technical Specification, 1-43, May 3, 2005.

Samsung Electronics, "OneNAND 4G (KFW4G16Q2M-DEB6), OneNAND 2G (KFH2G16Q2M-DEB6, OneNAND 1G (KFW16Q2M-DEB6)" Flash Memory, OneNANDTM Specification Ver. 1.2, 1-125, Dec. 23, 2005.

Gjessing, Stein, Performance of the RAMLink Memory Architecture, Proceedings of the Twenty-Seventh Annual Hawaii International Conference on System Sciences, IEEE 1060-3425/94, Jan. 1994, 154-162.

Gjessing, Stein et al, RAMLink: A High-Bandwidth Point-To-Point Memory Architecture, Proceedings COMPCOM 1992, IEEE 0-8186-2655-0/92, 328-331, Feb. 24, 1992.

Diamond, Steven L., Synclink: High-Speed Dram for the Future, Micro Standards, IEEE Micro, Dec. 1996, 74-75.

* cited by examiner

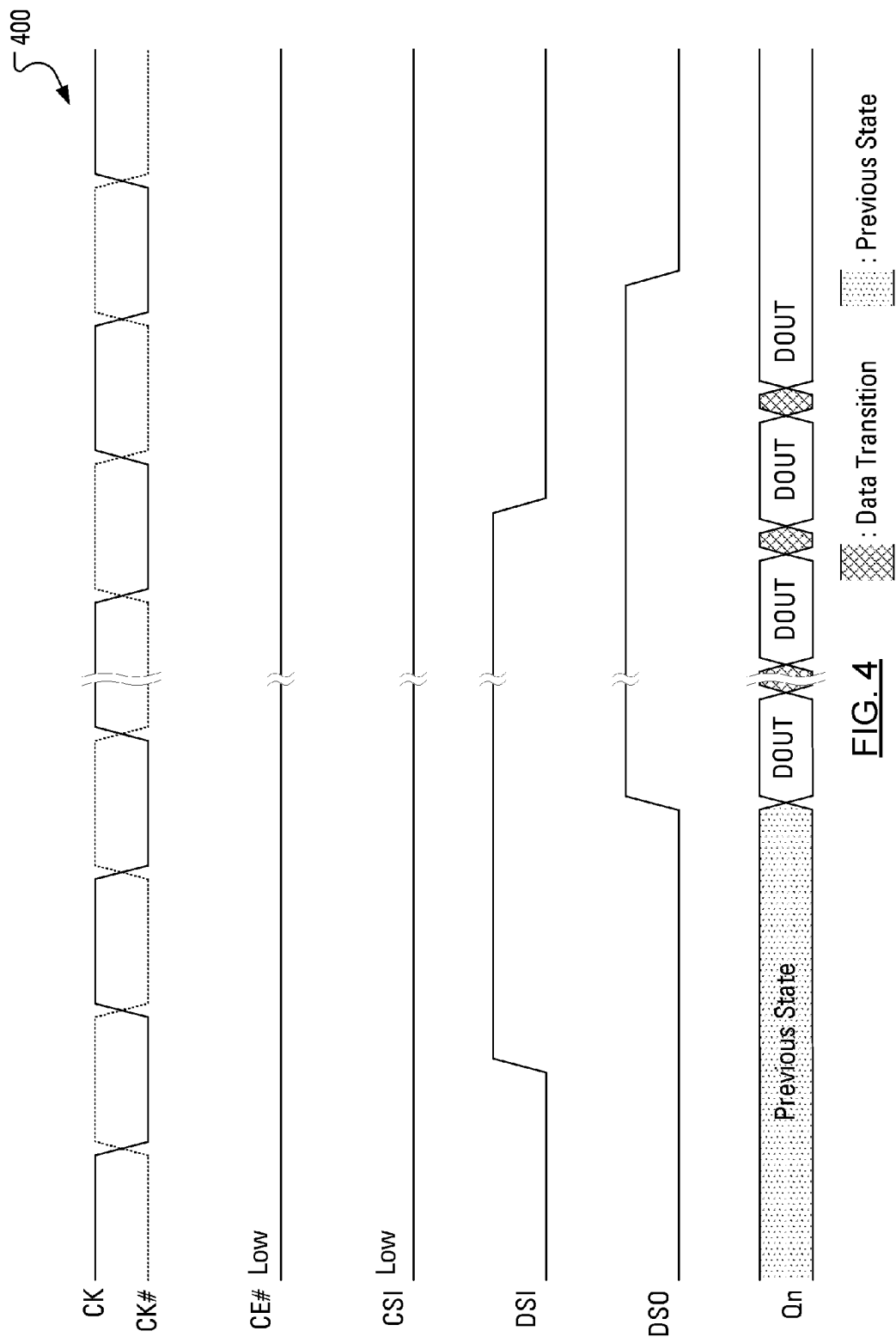

FIG. 5

| Operation | Command (2 Bytes) | | Row Address (3 Bytes) | Column Address (2 Bytes) | Input Data (1 to 2112 Bytes) |
|---|---|---|---|---|---|
| | Device Address (1 Byte) | Operation Code (1 Byte) | | | |
| Page Read | Valid | 0Xh | Valid | - | - |
| Page Read for Copy | Valid | 1Xh | Valid | - | - |
| Burst Data Read | Valid | 2Xh | - | Valid | - |
| Burst Data Load Start | Valid | 4Xh | - | Valid | Valid |
| Burst Data Load | Valid | 5Xh | - | Valid | Valid |
| Page Program | Valid | 6Xh | Valid | - | - |
| Partial Block Erase Address Input | Valid | 7Xh | Valid | - | - |
| Block Erase Address Input | Valid | 8Xh | Valid | - | - |
| Page-pair Erase Address Input | Valid | 9Xh | Valid | - | - |
| Erase | Valid | AXh | - | - | - |
| Operation Abort | Valid | CXh | - | - | - |
| Read Status Register | Valid | F0h | - | - | - |
| Read Device Information Register | Valid | F4h | - | - | - |
| Read Link Configuration Register | Valid | F7h | - | - | - |
| Write Link Configuration Register | FFh | FFh | - | - | Valid (1 Byte only) |

| | d0 | d1 | d2 | d3 |
|---|---|---|---|---|
| t0 | 1 | a0 | a1 | a2 |
| t1 | a3 | a4 | a5 | a6 |
| t2 | opcode 0 | | | |
| t3 | opcode 1 | | | |
| t4 | column address 0 | | | |
| t5 | column address 1 | | | |
| t6 | column address 3 | | | |
| t7 | column address 4 | | | |
| t8 | burst length (N) 0 | | | |
| t9 | burst length (N) 1 | | | |
| t10 | data 0 | | | |
| t11 | data 1 | | | |
| ... | ... | | | |
| t(9+2N) | data 2(N-1) | | | |

REDUCED PIN COUNT INTERFACE

CROSS REFERENCE TO RELATED APPLICATIONS

The present application is a divisional application of U.S. patent application Ser. No. 11/843,024, filed Aug. 22, 2007, the contents of which are hereby incorporated herein by reference.

FIELD

The present application relates generally to a controller and a set of controlled memory devices and, more specifically, to adapting the controller and the memory devices to a reduced pin count interface between the controller and the memory devices as well as between the memory devices.

BACKGROUND

In a typical electronic memory arrangement, reading from and writing to several memory devices is organized by a controller. Double-data-rate synchronous dynamic random access memory (DDR SDRAM) is an example of such an arrangement. For a write operation, the controller places data on a data bus while indicating, on a command bus, a write command, and indicating, on an address bus, a location on the particular memory device at which the data is to be stored. For a read operation, the controller indicates, on the command bus, a read command, and indicates, on an address bus, a location on the particular memory device from which the data is to be read. The memory device responds to the read command and address by placing the requested read data on the data bus.

In contrast, in an alternative electronic memory arrangement, memory devices are arranged in a ring or loop. Rather than a data bus, there is a data connection between a controller and a first memory device in the ring. The data connection may, for example, be a multibit bus. A data signal received at the first memory device on the data connection is passed on to a second memory device on an other data connection and a data signal received at the second memory device on the other data connection is passed on to a third memory device on a further data connection, etc. Thus, the data signal propagates around the ring until the data signal is returned to the controller. In addition to the data signal propagating through the ring, there are additional signals also propagating through the ring: a Command Strobe signal; and a Data Strobe signal.

For a write operation, the controller causes the Command Strobe signal to transition from "0" to "1" to indicate the start of a packet. Simultaneously, the controller starts to transmit, on the data connection, a write packet that includes: a write command indicating a particular memory device and address to which data is to be written followed by the data that is to be written. The controller then causes the Command Strobe signal to transition from "1" to "0" to indicate the end of the write packet.

For a read operation, the controller causes the Command Strobe signal to transition from "0" to "1" to indicate the start of a packet. Simultaneously, the controller starts to transmit, on the data connection, a read data packet that includes: a read command indicating a particular memory device and address from which the data is to be read. The controller then causes the Command Strobe signal to transition from "1" to "0" to indicate the end of the read command packet. Subsequently, the controller causes the Data Strobe signal to transition from "0" to "1" to indicate, to the particular memory device, that the requested read data is be transmitted on the data connection.

In the ring arrangement, a read command primes a memory device for a read data transfer. The length of a read is arbitrary and interruptible since the end of the read data transfer operation is determined by a transition of the Data Strobe signal from "1" to "0". Similarly, the length of a write is arbitrary and interruptible since the end of the write data transfer operation is determined by a transition of the Command Strobe signal from "1" to "0".

As discussed, when memory devices are arranged in a ring, packets originate at a controller and flow unidirectionally through a ring of memory devices and back to the controller. Different configurations are possible based on either distributing a clock in parallel or sourcing the clock synchronously along with the data and strobes. The second configuration has more pin overhead than the first configuration based on extra differential clock output pins.

Pin overhead continues to be a carefully monitored quality of interfaces between devices, such as the interface between the controller and the first memory device or between memory devices, with a lower pin overhead being desireable. That is, it is desireable to reduce the ratio of control pins to data pins.

BRIEF DESCRIPTION OF THE DRAWINGS

Reference will now be made to the drawings, which show by way of example, embodiments of the invention, and in which:

FIG. 4 illustrates a timing diagram for read data packet timing for the arrangement of FIG. 1;

FIG. 5 illustrates, in table format, an example command set for the arrangement of FIG. 1;

FIG. 12 illustrates an example 4-bit write command according to example embodiments.

DETAILED DESCRIPTION OF THE EMBODIMENTS

Figure 1:
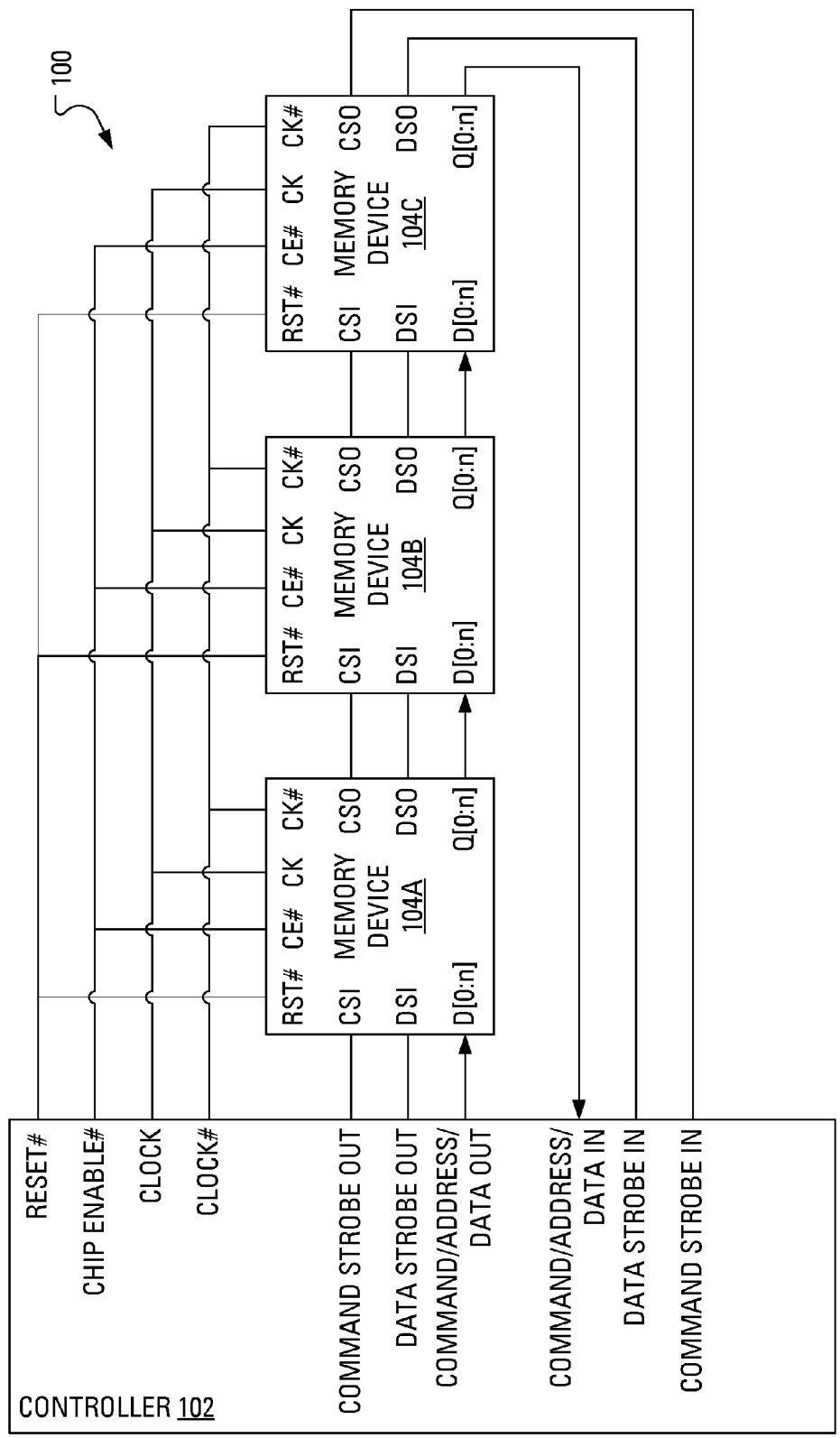
FIG. 1 illustrates a ring arrangement of memory devices configured for parallel clock distribution.

A memory controller may dispense with the requirement for strobe signals in ring-based memory arrangements by configuring the memory devices with an efficiently designed configuration command. The configuration command allows the controller to assign to each memory a device target device address and determine the data width of the ring.

In accordance with an example embodiment, there is provided, at a controller, a method of configuring a plurality of memory devices arranged in a ring such that output from a given memory device is received as input by a subsequent memory device around the ring, wherein a first memory device in the ring receives output from the controller as input and a last memory device provides output as input to the controller. The method includes, in a first clock cycle, transmitting, on each controller output bit of a plurality of controller output bits in a multibit data connection to the first memory device, a recognizable signal. The method also includes transmitting, in a number, M, of subsequent clock cycles and on subsets of controller output bits of the plurality of controller output bits in the multibit data connection, the recognizable signal, such that M+1 is equivalent to a ratio of a maximum configurable number of output bits in the multibit data connection to a minimum number of configurable output bits, the subsets of controller output bits including at least a first controller output bit. The method then includes, in each clock cycle of a further number, N, of subsequent clock cycles, transmitting, on the first controller output bit, a single-bit portion of an address a given memory device among the plurality of memory devices, such that N is equivalent to the number of bits used to address the each memory device. In other example embodiments, a memory device controller is provided for carrying out this method, a memory system is provided that includes a memory device controller for carrying out this method and a computer readable medium is provided for adapting a memory device controller to carry out this method.

In accordance with another example embodiment, there is provided, a method of configuring a plurality of memory devices arranged in a ring. The method includes initializing an operand, transmitting, on one or a plurality of controller output pins in a data connection to a first memory device of the plurality of memory devices, a command including the operand and determining that the command has not propagated around the ring and been received. The method also includes incrementing the operand, thereby creating an updated operand, transmitting, on the one or plurality of controller output pins, a further command including the updated operand and repeating the incrementing and transmitting the further command. The method also includes determining that a portion of the further command has been received on an active subset of controller input pins of a plurality of controller input pins, responsive to the determining that the portion has propagated around the ring and has been received, interrupting the repeating and transmitting packets on an active subset of controller output pins corresponding to the active subset of controller input pins. In other example embodiments, a memory device controller is provided for carrying out this method, a memory system is provided that includes a memory device controller for carrying out this method and a computer readable medium is provided for adapting a memory device controller to carry out this method.

Conveniently, aspects of the present application provide a memory, controller, or memory subsystem (either multidrop bus or ring topology) where the operational data width is configured by transmitting a pattern on the data bus. Additionally, there is provided a memory, controller, or memory subsystem in a ring topology where device addresses are assigned sequentially by the controller. Furthermore, there is provided a memory, controller, or memory subsystem in a ring topology where device addresses are assigned by the controller in a format that can be properly recognized by devices operating in multiple data widths. Still further, there is provided a memory, controller, or memory subsystem (either multidrop bus or ring topology) where devices recognize the start of a command by a known pattern different from a background idle pattern.

In an arrangement 100 illustrated in FIG. 1, a first memory device 104A, a second memory device 104B and a third memory device 104C (collectively or individually 104) are in a ring or loop arrangement. Operation of the memory devices 104 for writing or reading is organized by a controller 102.

The controller 102 is connected to the first memory device 104A by way of a Command Strobe Line, a Data Strobe Line and a Data bus. Similarly, the first memory device 104A is connected to the second memory device 104B by way of a Command Strobe Line, a Data Strobe Line and a Data bus. It follows that the second memory device 104B is connected to the third memory device 104C by way of a Command Strobe Line, a Data Strobe Line and a Data bus. Finally, the third memory device 104C is connected to the controller 102 by way of a Command Strobe Line, a Data Strobe Line and a Data bus. The controller 102 is also connected to each of the memory devices 104, in parallel, by a Reset line, a Chip Enable line, a Clock line and an inverse Clock line.

Figure 2:
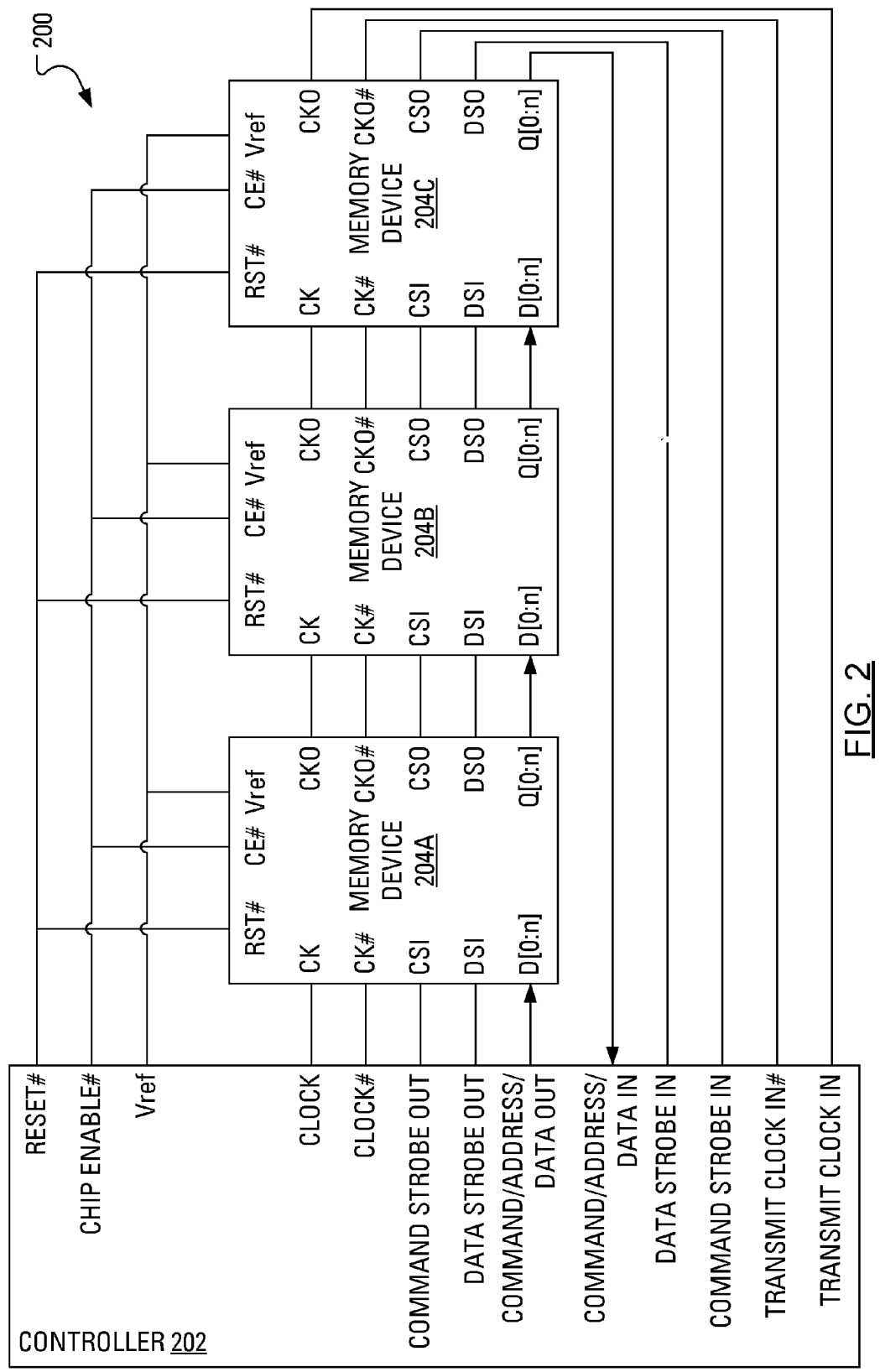
FIG. 2 illustrates a ring arrangement of memory devices configured for source synchronous clock distribution.

An arrangement 200 of memory devices illustrated in FIG. 2 differs from the arrangement 100 of FIG. 1 in that the clock signal (and the inverse of the clock signal) is distributed source synchronously with the strobes and data bus in the arrangement 200 of FIG. 2, whereas the clock signal (and the inverse of the clock signal) is distributed in a parallel manner in the arrangement 100 of FIG. 1.

In the arrangement 200 of FIG. 2, a controller 202 is connected to a first memory device 204A by way of a Command Strobe Line, a Data Strobe Line, a Data bus, a Clock line and an inverse Clock line. Similarly, the first memory device 204A is connected to a second memory device 204B by way of a Command Strobe Line, a Data Strobe Line, a Data bus, a Clock line and an inverse Clock line. It follows that the second memory device 204B is connected to a third memory device 204C by way of a Command Strobe Line, a Data Strobe Line, a Data bus, a Clock line and an inverse Clock line. Finally, the third memory device 204C is connected to the controller 202 by way of a Command Strobe Line, a Data Strobe Line, a Data bus, a Clock line and an inverse Clock line. The controller 202 is also connected to each of the memory devices 204, in parallel, by a Reset line, a Chip Enable line and a reference voltage line.

Figure 3:
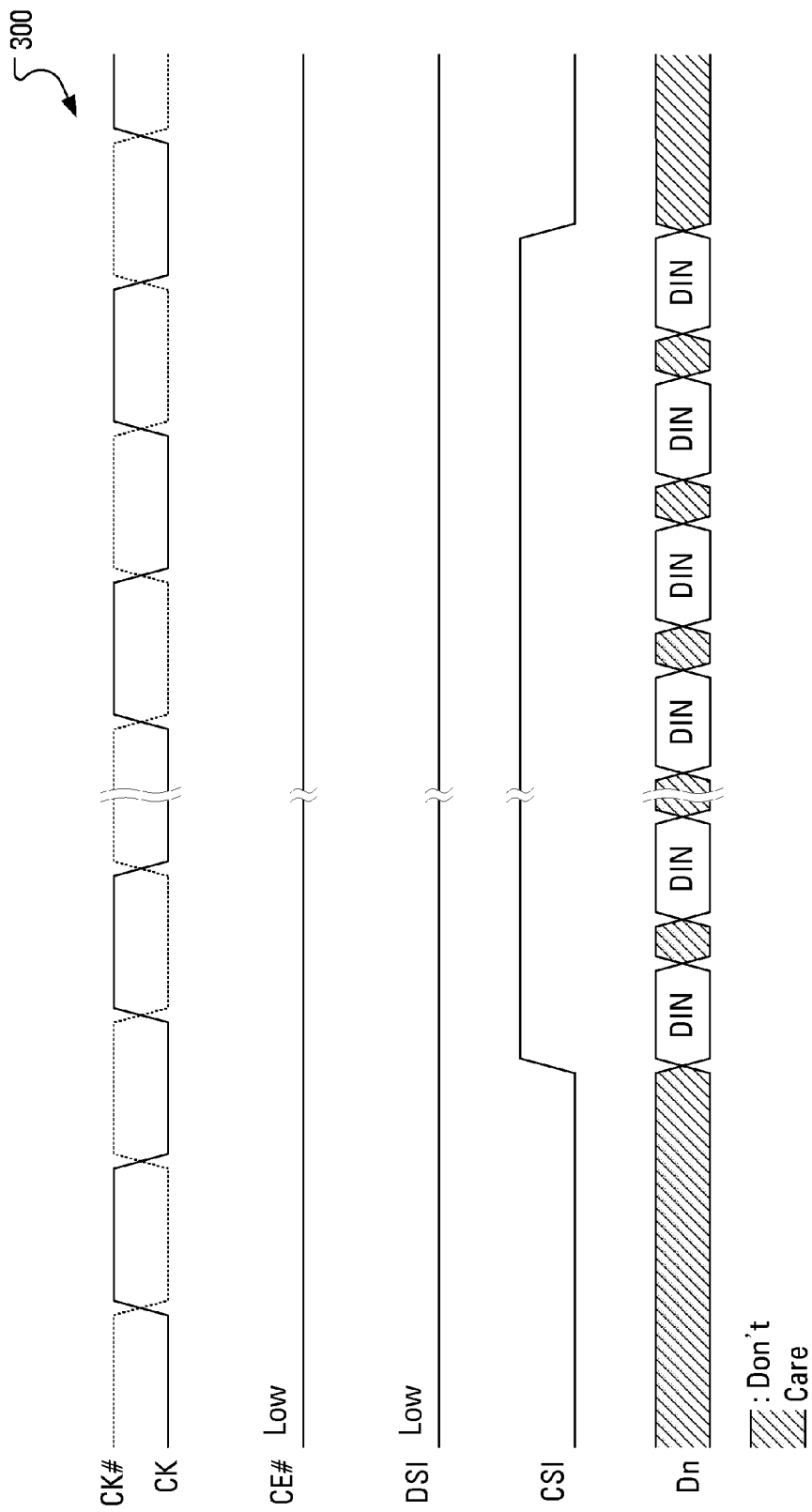
FIG. 3 illustrates a timing diagram for command and write data packet timing for the arrangement of FIG. 1.

In a timing diagram 300 in FIG. 3, command and write data packet timing is illustrated for the arrangement 100 of FIG. 1. Inputs to the memory device 104 on the (possibly multibit) Data bus may be representative of a command, representative of data, representative of a target device address, or representative of an address within the memory device. Inputs on the Data bus may be captured (shifted in to registers) on the crossing of the signal on the Clock line (CK) with the signal on the inverse Clock line (CK#) when the signal on the Chip Enable (CE#) line is at a logical LOW and the signal on the Command Strobe line (received at the CSI pin) is at a logical HIGH.

In a timing diagram 400 in FIG. 4, read data packet timing is illustrated for the arrangement 100 of FIG. 1. Output on the Data bus may be synchronously shifted out at the crossing of the signal on the Clock line (CK) with the signal on the inverse Clock line (CK#) when the signal on the Chip Enable (CE#) line is at a logical LOW and the signal on the Data Strobe line (received at the DSI pin) is at a logical HIGH. There is a fixed latency in the memory from the time the logical HIGH on the DSI pin is received and when a logical HIGH on the DSO pin and the accompanying read data are output.

An example command set for the memory device arrangement 100 of FIG. 1 is illustrated, in table format, in FIG. 5. The example command set may also be seen as Table 3 in U.S. Provisional Patent Application Ser. No. 60/902,003, filed Feb. 16, 2007, the contents of which are hereby incorporated herein by reference. Notably, in the Operation Code column, X=0 h when the operation is to be performed on memory bank 0 and X=1 h when the operation is to be performed on memory bank 1, etc. Furthermore, the "Write Link Configuration Register" command has a Device Address of FFh because the command is a "broadcasting only" command.

Figure 6:
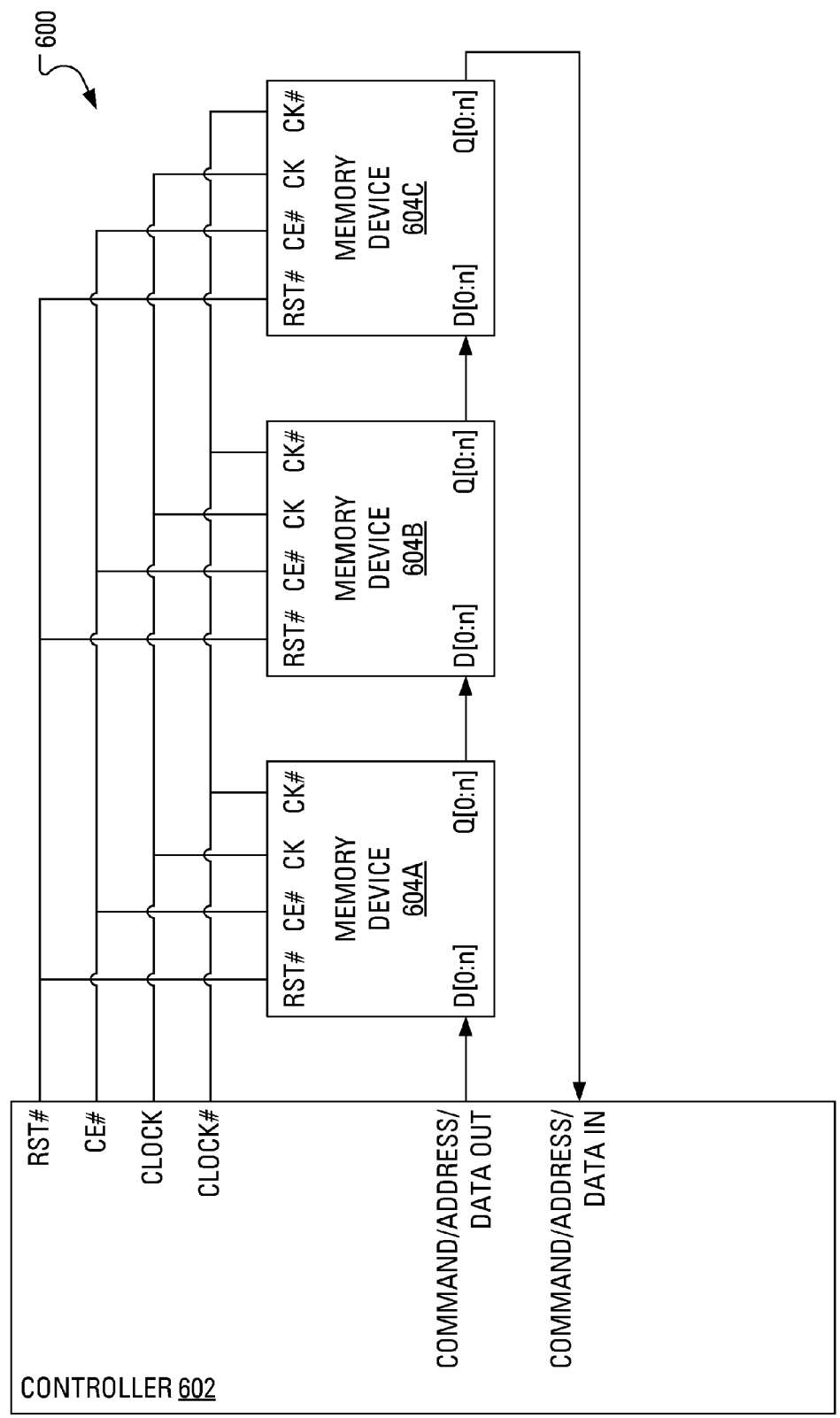
FIG. 6 illustrates a novel arrangement of memory devices configured for parallel clock distribution.

In a novel arrangement 600 illustrated in FIG. 6, a first memory device 604A, a second memory device 604B and a third memory device 604C (collectively or individually 604) are in a ring or loop arrangement. Operation of the memory devices 604 for writing or reading is organized by a controller 602.

The controller 602 is connected to the first memory device 604A by way of a unidirectional, point-to-point Data bus. Similarly, the first memory device 604A is connected to the second memory device 604B by way of a unidirectional, point-to-point Data bus. It follows that the second memory device 604B is connected to the third memory device 604C by way of a unidirectional, point-to-point Data bus. Finally, the third memory device 604C is connected to the controller 602 by way of a unidirectional, point-to-point Data bus. The controller 602 is also connected to each of the memory devices 604, in parallel, by a Reset line, a Chip Enable line, a Clock line and an inverse Clock line.

Figure 10:
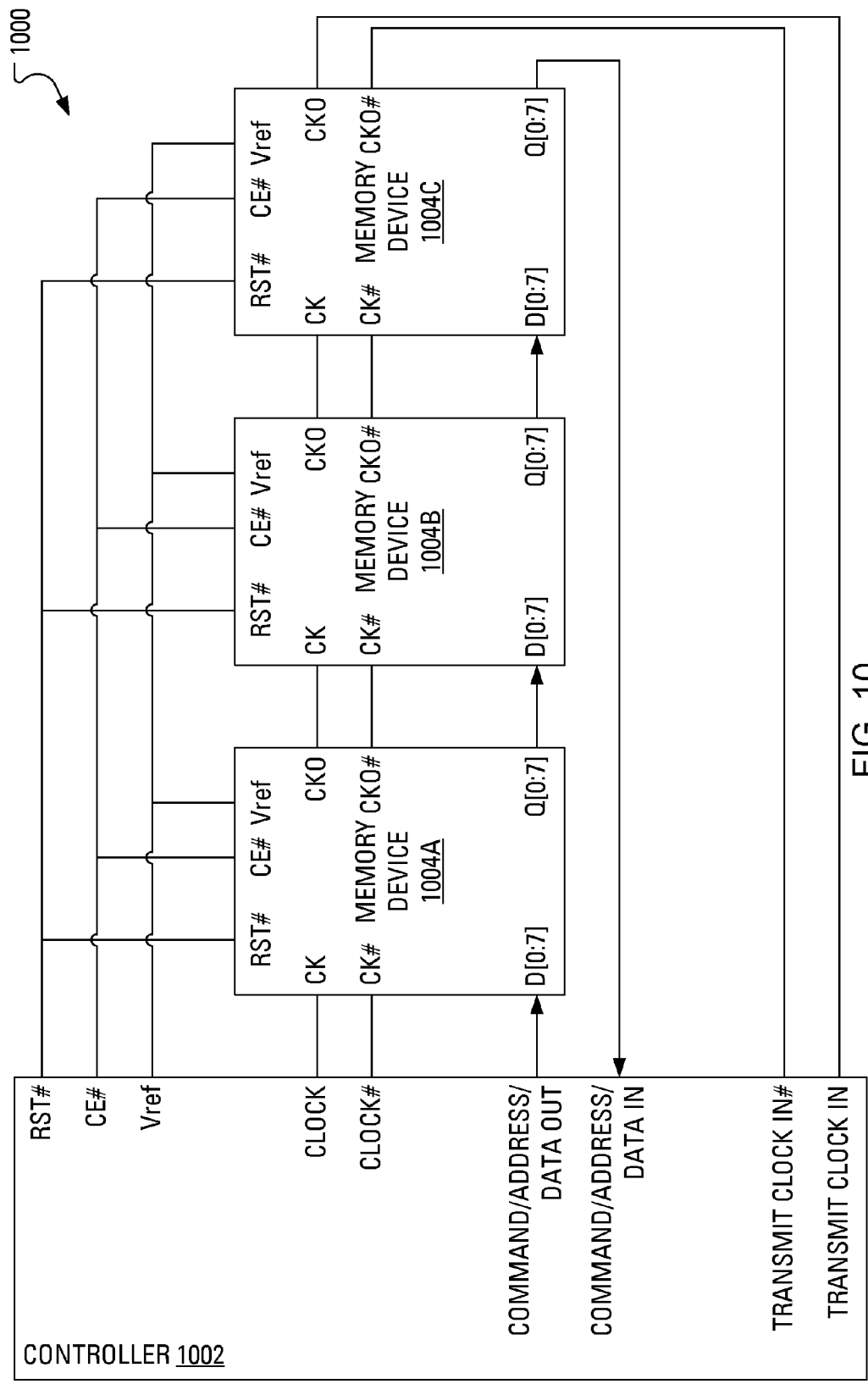
FIG. 10 illustrates a novel arrangement of memory devices configured for synchronous clock distribution.

A novel arrangement 1000 of memory devices illustrated in FIG. 10 differs from the novel arrangement 600 of FIG. 6 in that the clock signal (and the inverse of the clock signal) is distributed source-synchronously with the Data bus in the arrangement 1000 of FIG. 10, whereas the clock signal (and the inverse of the clock signal) is distributed in a parallel manner in the arrangement 600 of FIG. 6.

In the arrangement 1000 of FIG. 10, a controller 1002 is connected to a first memory device 1004A by way of a unidirectional, point-to-point Data bus, a Clock line and an inverse Clock line. Similarly, the first memory device 1004A is connected to a second memory device 1004B by way of a unidirectional, point-to-point Data bus, a Clock line and an inverse Clock line. It follows that the second memory device 1004B is connected to a third memory device 1004C by way of a unidirectional, point-to-point Data bus, a Clock line and an inverse Clock line. Finally, the third memory device 1004C is connected to the controller 1002 by way of a unidirectional, point-to-point Data bus, a Clock line and an inverse Clock line. The controller 1002 is also connected to each of the memory devices 1004, in parallel, by a Reset line, a Chip Enable line and a reference voltage line.

In overview, the memory device arrangement 600 of FIG. 6 provides an alternative to the memory device arrangement 100 of FIG. 1. In particular, the memory device arrangement 600 of FIG. 6 provides a reduced pin count interface between the controller 602 and the first memory device 604A and between successive memory devices 604. Facilitating the reduced pin count interface are some operations performed by the controller 602. The controller 602 determines a desired width for the Data bus while assigning a target device address to each of the memory devices 604. Similarly, the memory device arrangement 1000 of FIG. 10 provides an alternative to the memory device arrangement 200 of FIG. 2. In particular, the memory device arrangement 1000 of FIG. 10 provides a reduced pin count interface between the controller 1002 and the first memory device 1004A and between successive memory devices 1004. Indeed, while the following is described in relation to the arrangement 600 of FIG. 6, it should be appreciated that the discussion applies equally to the arrangement 1000 of FIG. 10.

Upon power on or after reset, each of the memory devices 604 of FIG. 6 assume default characteristics. In particular, upon power on or after reset each memory device has all ones in a device address register. That is, if the device address register (not shown) is a seven-bit address register, upon power on or after reset, the address register holds an address of "1111111". Additionally, all pins Q[0:n] that shift data to the Data bus are arranged to output logical low, i.e., "0". Also upon power on or after reset, the controller 602 transmits idle commands, consisting of continuous "0"s, to the input pins D[0:n] of the first memory device 604A.

To facilitate operation without strobe signals, all packets emanating from the controller 602 have a length that can be determined by decoding the command portion of the packet.

Figure 7:
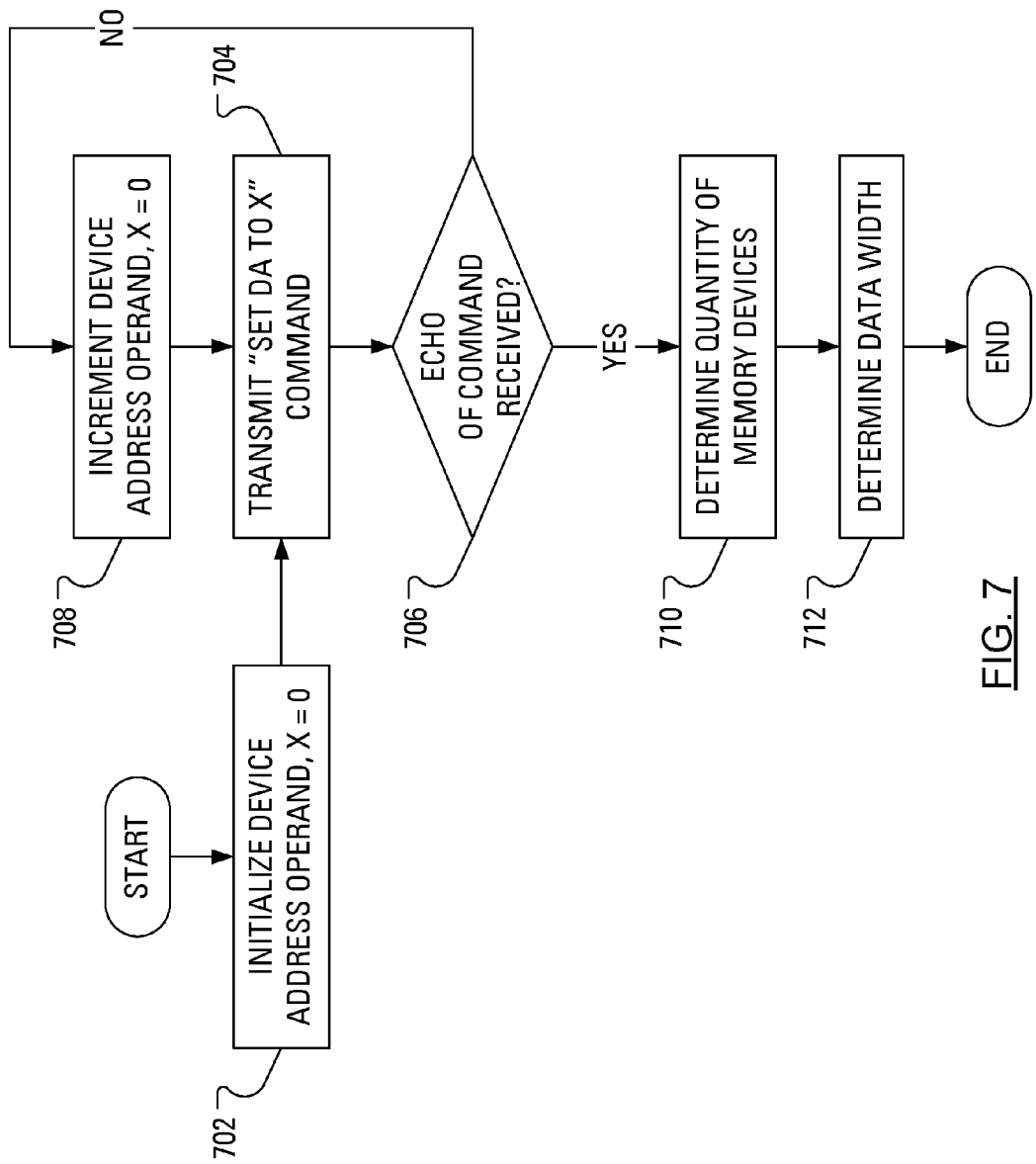
FIG. 7 illustrates steps in an example method of configuring each of the memory devices with a distinct target device address according to example embodiments.

After reset, the controller 602 executes a configuration method, example steps of which are presented in FIG. 7.

Figure 8:
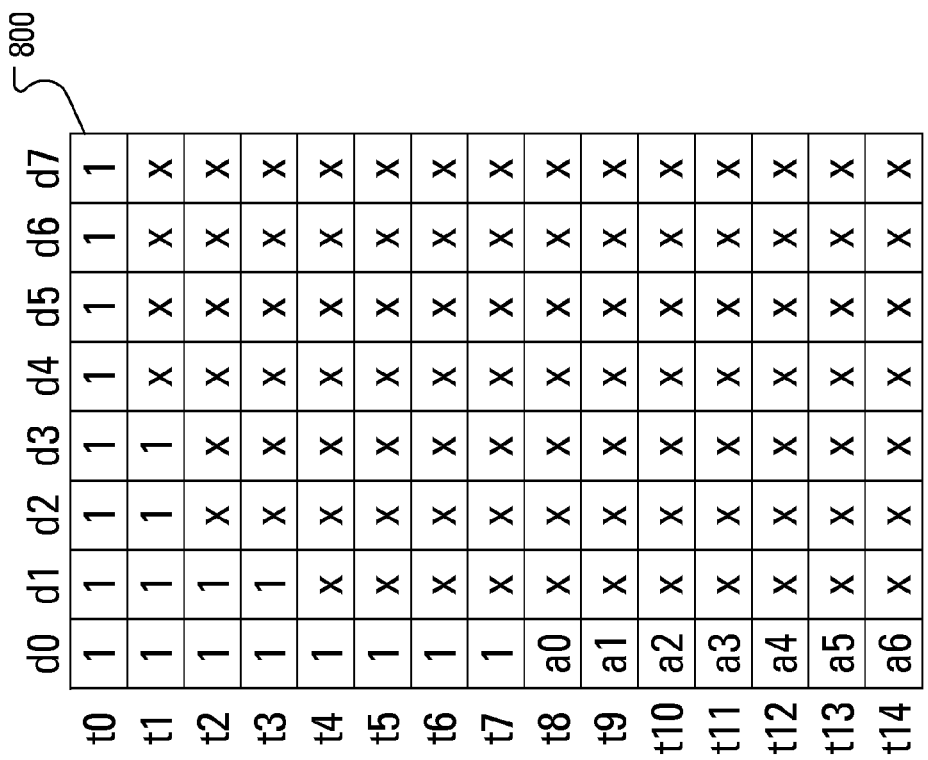
FIG. 8 illustrates an example configuration command according to example embodiments.

The controller 602 begins by initializing (step 702) a target device address operand, X=[a0, a1, a2, a3, a4, a5, a6], to zero, e.g., X=[0, 0, 0, 0, 0, 0, 0]. The controller 602 then transmits (step 704) a "Set TDA to X" command. An example "Set TDA to X" command 800 is illustrated in FIG. 8. The "Set TDA to X" command 800 primarily has two components. The first component may be considered as a device address or as an operational code (opcode). The second component is the operand, X. The example "Set TDA to X" 800 command extends for 16 clock cycles (t0-t14) and is arranged to be suitable for setting the TDA in rings of a variety of data widths.

For the first component to be considered to be a device address, each of the memory devices 604 should have their respective seven-bit (for this example) TDA registers filled with "1"s after power on or reset. For the first component to be considered an op code, each of the memory devices 604 should recognize eight received "1" bits as representative of the only command the memory device 604 is prepared to execute while in the reset state. Furthermore, for operation without strobes, all commands starts with a known pattern, in this case, "1" in bit position d0, to distinguish a command from the idle background of "0".

In the situation wherein a ring of memory devices has an eight-bit data width (i.e., x8), the eight bits received in the first clock cycle, t0, by a memory device in the reset state may be recognized as the beginning of a "Set TDA to X" command. The memory device may then ignore the data received in clock cycles t1-t7. The memory device may then overwrite its TDA register with the value received on the first bit (d0) of the data bus for the clock cycles t8-t14.

In the situation wherein a ring of memory devices has a four-bit data width (i.e., x4), the four bits received in the first clock cycle, t0, on the first four bits (d0, d1, d2, d3) of the data bus along with the four bits received in the second clock cycle, t1, on the first four bits of the data bus by a memory device in the reset state may be recognized as the beginning of a "Set TDA to X" command. The memory device may then ignore the data received in clock cycles t2-t7. The memory device may then overwrite its TDA register with the value received on the first bit (d0) of the data bus for the clock cycles t8-t14.

In the situation wherein a ring of memory devices has a two-bit data width (i.e., x2), the two bits received in the first clock cycle, t0, on the first two bits (d0, d1) of the data bus along with the two bits received in the second clock cycle, t1, on the first two bits of the data bus, the two bits received in the third clock cycle, t2, on the first two bits of the data bus, and the two bits received in the fourth clock cycle, t3, on the first two bits of the data bus by a memory device in the reset state may be recognized as the beginning of a "Set TDA to X" command. The memory device may then ignore the data received in clock cycles t4-t7. The memory device may then overwrite its TDA register with the value received on the first bit of the data bus for the clock cycles t8-t14.

In the situation wherein a ring of memory devices has a one-bit data width (i.e., x1), the eight bits received in the first eight clock cycles, t0-t7, on the first bit of the data bus, by a memory device in the reset state may be recognized as the beginning of a "Set TDA to X" command. The memory device may then overwrite its TDA register with the value received on the first bit of the data bus for the clock cycles t8-t14.

In general, a number, M, of clock cycles that follow the first clock cycle, t0, is selected such that M+1 is equivalent to a ratio of a maximum configurable number of output bits in the multibit data connection to a minimum number of configurable output bits. Additionally, a further number, N, of subsequent clock cycles, such that N is equivalent to the number of bits used to address each memory device.

As will be clear to a person of ordinary skill in the art, the number of clock cycles necessary for the "Set TDA to X" command (M+N+1) is dependent upon the size of the address to be written to the TDA register in each memory device as well as the size of the opcode or address to be used to signify, to the memory devices, that the command is a "Set TDA to X" command. In this case, the address to be written is a seven-bit address and eight bits are used to signify the unique command. Accordingly, fifteen clock cycles are required to ensure that the unique command can be properly received by a ring of x1 memory devices. It follows that in the case wherein the address to be written is a three-bit address and four bits are used to signify the unique command, seven clock cycles would be required to ensure that the unique command can be properly received by a ring of x1 memory devices.

It may seem that the bits transmitted across the breadth of the data bus are extraneous, given that all necessary information is carried on the first bit (d0) of the data bus over the course of the command. However, as will be discussed below, once a TDA has been set for all memory devices, a transmitted "Set TDA to X" command traverses the entire ring and returns to the controller. The controller can then determine, in the first clock cycle, the data width of the ring from the received "1"s first bits of the data bus.

Notably, the data width of a ring of memory devices is established upon the installation of the memory devices. In an arrangement 900 illustrated in FIG. 9, a first memory device 904A, a second memory device 904B and a third memory device 904C (collectively or individually 904) are in a ring or loop arrangement. Operation of the memory devices 904 for writing or reading is organized by a controller 902.

The controller 902 is connected to the first memory device 904A by way of a Data bus. Similarly, the first memory device 904A is connected to the second memory device 904B by way of a Data bus. It follows that the second memory device 904B is connected to the third memory device 904C by way of a Data bus. Finally, the third memory device 904C is connected to the controller 902 by way of a Data bus. For ease of illustration, the Reset line, the Chip Enable line, the Clock line and the inverse Clock line are omitted.

Figure 9:
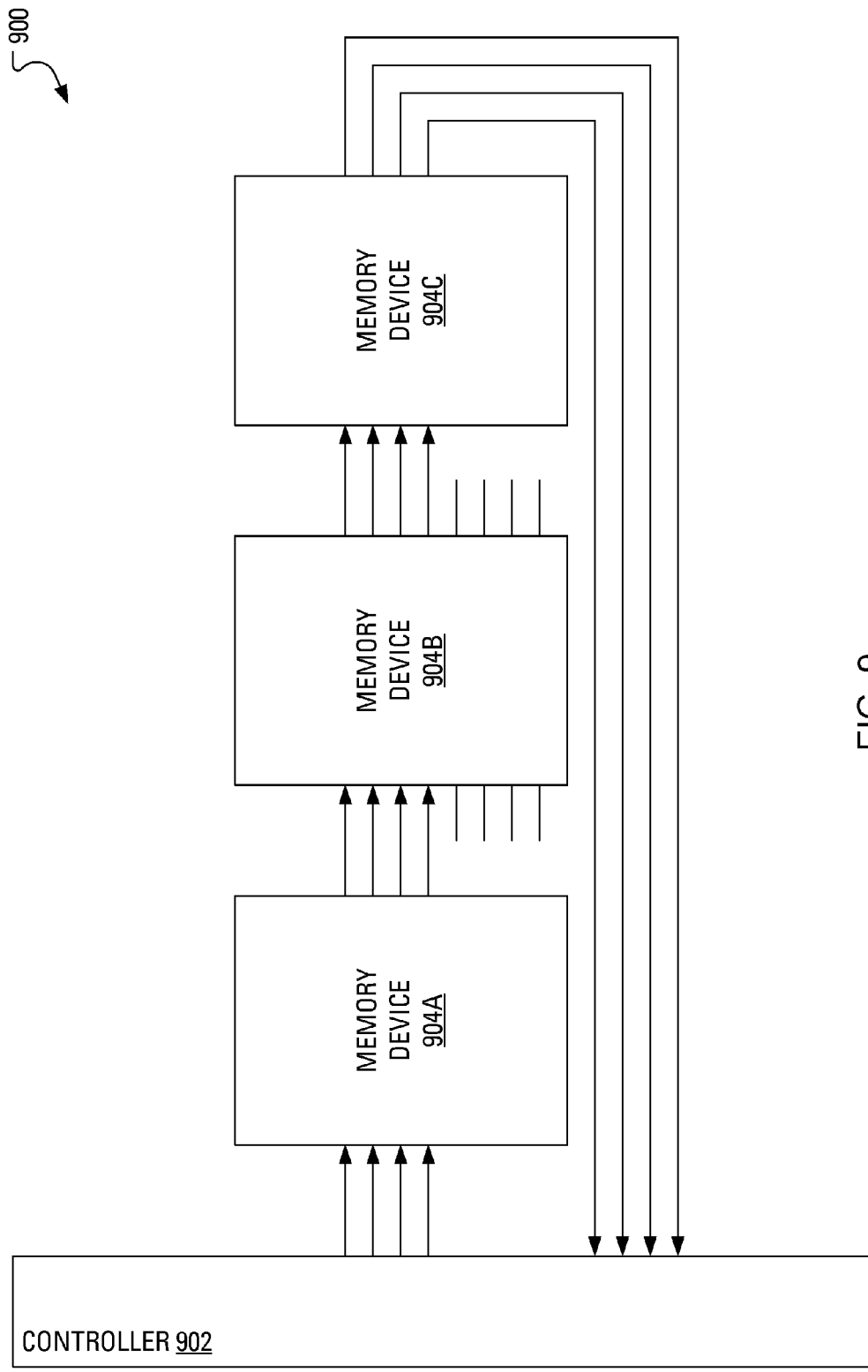
FIG. 9 illustrates a simplified arrangement of memory devices to illustrate non-uniform data widths.

Both the first memory device 904A and the third memory device 904C are 4-bit data bus devices, while the second memory 904B device is an 8-bit data bus device. In order that the data bus be a consistent width throughout the arrangement 900 of FIG. 9, four of the data bus inputs on the second memory device 904B are connected to ground during installation of the second memory device 904B in the arrangement 900 of FIG. 9. Although the width of the data bus in the arrangement 900 of FIG. 9 is established upon installation of the components, the controller 902 is not aware of the width of the data bus until completion of a configuration method, an example of which is provided in FIG. 7.

In operation, in a "recently reset" state, the only command a memory device 604 is prepared to accept is a "Set TDA to X" command. Upon receiving the "Set TDA to X" command from the controller 602, the first memory device 604A recognizes that it is prepared to accept the command and, according to the command, overwrites its internal TDA register with the value contained in the operand X, which, in this case, is "0". As the "Set TDA to X" command is a special command, the first memory device 604A does not transmit the command on the Data bus output pins Q[0:n].

Subsequently, the controller 602 determines (step 706) whether an echo of the command sent in step 704 has been received. Where an echo has not been received, the controller 602 increments the operand (step 708).

The controller 602 then transmits a "Set TDA to X" command, with operand X="1". Since the first memory device 604A is no longer in a "recently reset" state, the first memory device 604A recognizes that the command is not intended for itself. Consequently, the first memory device 604A retransmits the received command on the Data bus output pins Q[0:n]. The command is received on the Data bus input pins D[0:n] at the second memory device 604B.

Upon receiving the "Set TDA to X" command from the first memory device 604A, the second memory device 604B recognizes that it is prepared to accept the command and, according to the command, overwrites its internal TDA register with the value contained in the operand X, which, in this case, is "1". As the "Set TDA to X" command is a special command, the second memory device 604B does not transmit the command on the Data bus output pins Q[0:n].

Subsequently, the controller 602 determines (step 706) whether an echo of the command sent in step 704 has been received. Where an echo has not been received, the controller 602 increments (step 708) the operand.

The controller 602 then transmits (step 704) a "Set TDA to X" command, with operand X="2". Since the first memory device 604A is no longer in a "recently reset" state, the first memory device 604A recognizes that the command is not intended for itself. Consequently, the first memory device 604A retransmits the received command on the Data bus output pins Q[0:n]. The command is received on the Data bus input pins D[0:n] at the second memory device 604B. Since the second memory device 604B is no longer in a "recently reset" state, the second memory device 604B recognizes that the command is not intended for itself. Consequently, the second memory device 604B retransmits the received command on the Data bus output pins Q[0:n]. The command is received on the Data bus input pins D[0:n] at the third memory device 604C.

Upon receiving the "Set TDA to X" command from the second memory device 604B, the third memory device 604C recognizes that it is prepared to accept the command and, according to the command, overwrites its internal TDA register with the value X, which, in this case, is "2". As the "Set TDA to X" command is a special command, the third memory device 604C does not transmit the command on the Data bus output pins Q[0:n].

Subsequently, the controller 602 determines (step 706) whether an echo of the Set TDA to X command sent in step 704 has been received. Where an echo has not been received, the controller 602 increments (step 708) the operand.

The controller 602 then transmits (step 704) a "Set TDA to X" command, with operand X="3". Since the first memory device 604A is no longer in a "recently reset" state, the first memory device 604A recognizes that the command is not intended for itself. Consequently, the first memory device 604A retransmits the received command on the Data bus output pins Q[0:n]. The command is received on the Data bus input pins D[0:n] at the second memory device 604B. Since the second memory device 604B is no longer in a "recently reset" state, the second memory device 604B recognizes that the command is not intended for itself. Consequently, the second memory device 604B retransmits the received command on the Data bus output pins Q[0:n]. The command is received on the Data bus input pins D[0:n] at the third memory device 604C. Since the third memory device 604C is no longer in a "recently reset" state, the third memory device 604C recognizes that the command is not intended for itself. Consequently, the third memory device 604C retransmits the received command on the Data bus output pins Q[0:n]. The command is received on the Data bus input pins D[0:n] at the controller 602.

Subsequently, the controller 602 determines (step 706) whether an echo of the Set TDA to X command sent in step 704 has been received. Where an echo has been received, the controller 602 can then determine (step 710) the quantity of memory devices 604 in the ring and can be confident that each memory device 604 has been configured with a target device address. In particular, the quantity of memory devices 604 in the ring is the value of the operand when the controller 602 receives an echo of the most recently transmitted Set TDA to X command. In the above example, the operand X=3 when the controller 602 receives an echo of the most recently transmitted command. Consequently, the controller 602 determines (step 710) that there are three memory devices 604.

Another determination made by the controller 602 upon receipt of an echo of the most recent Set TDA to X command is the data width for the ring. In particular, the controller 602 may determine (step 712) the data width for the ring based on the number of adjacent 1s received in the first clock cycle. Upon determining (step 712) the data width for the ring, the configuration method of FIG. 7 may be considered complete.

In the general case, the controller 602 continues transmitting (step 704) "Set TDA to X" commands, incrementing (step 708) the operand X each time, until the controller 602 determines (step 706) that an echo of the most recently transmitted command has been received.

The configuration method described in FIG. 7 allows a printed circuit board to be populated with memory devices that support the desired data width or larger data widths. On receiving the "Set TDA to X" command, a memory device supporting a larger data width will recognize that only a fraction of its Data bus inputs are received as "1"s, and will configure itself to operate in a narrower mode.

Another case arises when memory devices can only support a width narrower than the Data bus on the controller or printed circuit board. The controller will initialize the ring with a desired Data bus width. At some point the width of the "Set TDA to X" commands will be truncated. When the final "Set TDA to X" command is received at the controller inputs, it will be truncated to the narrowest width supported by memory devices in the ring. At this point the controller must reset the ring and retransmit "Set TDA to X" commands with the narrower width, to eliminate the possibility that a device supporting a wider width was positioned upstream of the narrowest device.

A final case arises when the controller wishes to set the operating Data bus width to a width narrower than the width supported by ring. In this case it can simply initialize the ring by transmitting "Set TDA to X" commands with the desired narrow width. Alternatively, the controller can dynamically change the width during operation depending on performance requirements. On initialization, the controller can determine the width supported by the ring to determine the range of possible adjustment.

In subsequent operation, each memory device 604 passes data received on the Data bus input pins D[0:n] through to the Data bus output pins Q[0:n], except in response to a read data command packet or a read register command packet. Upon receiving one of these read command packets, which read command packets are expected to include a read location address from which to read, the memory device 604 obtains data from the read location address. When transmitting the read command packet on the Data bus output pins Q[0:n], the memory device 604 inserts the data obtained from the read location address into the read command packet.

In one embodiment, the latency for read operations is fixed. Advantageously, when the latency for read operations is fixed, other memory devices 604 on the circuit can snoop the Data bus and understand when data is being transferred, so that the memory devices 604 will not confuse data obtained responsive to a read operation with actual instructions.

Figure 11:
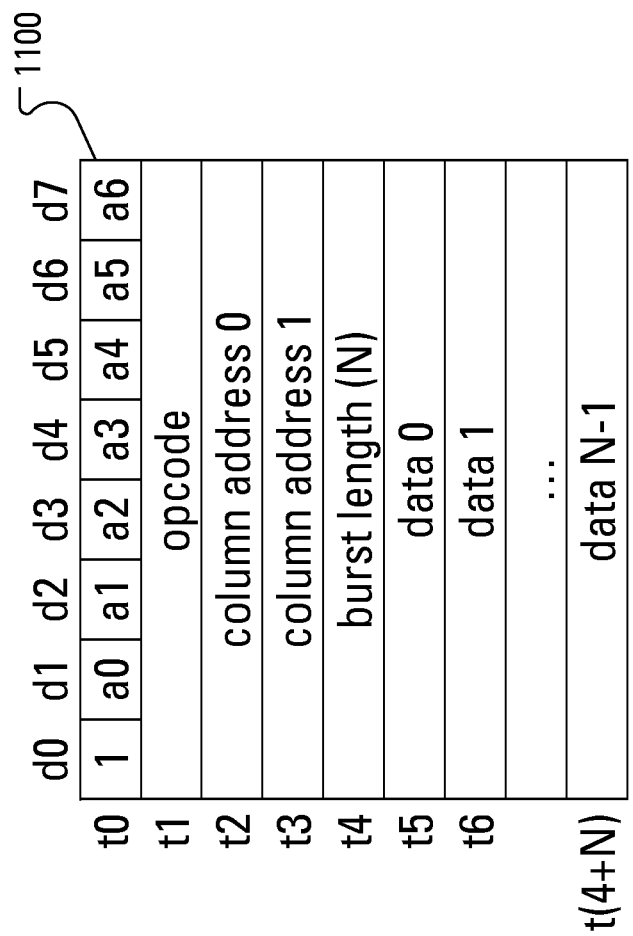
FIG. 11 illustrates an example 8-bit write command according to example embodiments.

An example of a write command packet 1100 is presented in FIG. 11. The write command packet 1100 is for use once the controller 602 has determined that the memory devices 604 are configured for 8-bit operation. The value "1" in the first bit (d0) allows the memory devices 604 to recognize the beginning of a command packet in an environment without strobes. The remaining bits of the first eight bits transferred at time t0 can accommodate a 7-bit TDA (a0-a6). As illustrated, the eight bits transferred at time t1 comprise an opcode. In this example, the opcode would identify a write command. The subsequent 16 bits, transferred at time t2 and t3, are identified in FIG. 11 as comprising a column address. Without strobes, a mechanism is required to allow a given memory device 604 to determine the end of a command packet. In one example mechanism, each command has a fixed data transfer length. In another example mechanism, a variable burst length parameter is inserted into the command. As shown in the write command packet 1100, a variable burst length parameter is transferred at time t4. The remainder of the write command packet 1100, transferred at time t5 through time t(4+N), contains the data to be written.

A further example of a write command packet 1200 is presented in FIG. 12. The write command packet 1200 is for use once the controller 1002 of FIG. 10 has determined that the memory devices 1004 are configured for 4-bit operation. The value "1" in the first bit (d0) allows the memory devices 1004 to recognize the beginning of a command packet in an environment without strobes. The remaining bits of the first eight bits transferred at time t0 and time t1 can accommodate a 7-bit TDA (a0-a6). As illustrated, the eight bits transferred at time t2 and time t3 comprise an opcode. In this example, the opcode would identify a write command. The subsequent 16 bits, transferred at time t4 through time t7, are identified in FIG. 12 as comprising a column address. As shown in the write command packet 1200, a variable burst length parameter is transferred at time t8 and t9. The remainder of the write command packet 1200, transferred at time t10 through time t(9+2N), contains the data to be written.

Advantageously, the adaptations proposed herein for the controller 602 allow for significant pin count reduction to be achieved at the cost of a minor reduction in flexibility. In known memory devices adapted for ring-based arrangements, there have been a total of four strobe pins on each device: a Data Strobe In (DSI) pin; a Data Strobe Out (DSO) pin; a Command Strobe In (CSI) pin; and a Command Strobe Out (CSO) pin. For a memory device configured for a parallel clock, eliminating the strobe pins desirably reduces the number of non-data pins from eight to four. For a memory device configured for a source synchronous clock, eliminating the strobe pins desirably reduces the number of non-data pins from 11 to seven.

As will be apparent to a person of ordinary skill in the art, aspects of the present application are just as applicable to a multidrop bus topology as they are to a ring topology.

The above-described embodiments of the present application are intended to be examples only. Alterations, modifications and variations may be effected to the particular embodiments by those skilled in the art without departing from the scope of the application, which is defined by the claims appended hereto.

What is claimed is:

1. A memory device adapted for connection with a controller and one or more other memory devices arranged in a ring topology, said memory device comprising a data input connection for receiving device address assignment commands and a data output connection for forwarding said device address assignment commands, where said device address assignment commands include to-be-assigned device addresses, and said memory device being adapted to:
   receive, from the controller, a first one of said device address assignment commands on said data input connection;
   record a to-be-assigned device address of said first one of said device address assignment commands;
   receive, from the controller, a subsequent one of said device address assignment commands on said data input connection; and
   forward said subsequent one of said device address assignment commands on said data output connection.

2. The memory device of claim 1 further adapted to receive packets including a target device address and an instruction on said data input connection, said memory device executing said instruction if said target device address matches said recorded to-be-assigned device address, said memory device forwarding said packet on said data output connection if said target device address does not match said recorded to-be-assigned device address.

3. The memory device of claim 2 wherein said packets include command and write data packets.

4. The memory device of claim 2 wherein said instruction includes a selected one of page read, burst data read, burst data load, page program, block erase address input, and block erase commands.

5. The memory device of claim 1 wherein said data input connection and said data output connection are single bit connections.

6. The memory device of claim 1 wherein said data input connection and said data output connection are multiple bit connections.

7. The memory device of claim 1 wherein said data input connection and said data output connection are configurable data width connections.

8. A method carried out in a memory device in communication with a controller and one or more other memory devices arranged in a ring topology, the method comprising:
   receiving, from the controller, a first one of device address assignment commands on a data input connection of the memory device;
   recording a to-be-assigned device address included in said first one of said device address assignment commands;
   receiving, from the controller, a subsequent one of said device address assignment commands on said data input connection; and
   forwarding said subsequent one of said device address assignment commands on a data output connection of the memory device.

9. The method of claim 8 further comprising receiving packets including a target device address and an instruction on said data input connection, and executing said instruction if said target device address matches said recorded to-be-assigned device address, and forwarding said packet on said data output connection if said target device address does not match said recorded to-be-assigned device address.

10. The method of claim 9 wherein said packets include command and write data packets.

11. The method of claim 9 wherein said instruction includes a selected one of page read, burst data read, burst data load, page program, block erase address input, and block erase commands.

12. A system comprising:
   a controller;
   a first memory device; and
   at least a second memory device, and said second memory device, said first memory device, and said controller being communicatively arranged in a ring topology, said first memory device comprising a data input connection for receiving device address assignment commands and a data output connection for forwarding said device address assignment commands, and said first memory device being adapted to:
      receive, from the controller, a first one of said device address assignment commands on said data input connection;
      record a to-be-assigned device address included in said first one of said device address assignment commands;
      receive, from the controller, a subsequent one of said device address assignment commands on said data input connection; and
      forward said subsequent one of said device address assignment commands on said data output connection.

13. The system of claim 12 wherein said first memory device is further adapted to receive packets including a target device address and an instruction on said data input connection, said first memory device executing said instruction if said target device address matches said recorded to-be-assigned device address, said first memory device forwarding said packet on said data output connection if said target device address does not match said recorded to-be-assigned device address.

14. The system of claim 13 wherein said packets include command and write data packets.

15. The system of claim 13 wherein said instruction includes a selected one of page read, burst data read, burst data load, page program, block erase address input, and block erase commands.

16. The system of claim 12 wherein said data input connection and said data output connection are single bit connections.

17. The system of claim 12 wherein said data input connection and said data output connection are multiple bit connections.

18. The system of claim 12 wherein said data input connection and said data output connection are configurable data width connections.

* * * * *